US012646682B2

(12) United States Patent
Sinclair et al.

(10) Patent No.: US 12,646,682 B2
(45) Date of Patent: Jun. 2, 2026

(54) HEATED PLASMA FLOOD GUN SWEEPER

(71) Applicant: Applied Materials, Inc., Santa Clara, CA (US)

(72) Inventors: Frank Sinclair, Hartland, ME (US); Paul Joseph Murphy, Reading, MA (US); Bon-Woong Koo, Andover, MA (US); Gregory Edward Stratoti, Sandown, NH (US); Tseh-Jen Hsieh, Rowley, MA (US); Alexandre Likhanskii, Middleton, MA (US); Glenn Green, Woburn, MA (US)

(73) Assignee: Applied Materials, Inc., Santa Clara, CA (US)

( * ) Notice: Subject to any disclaimer, the term of this patent is extended or adjusted under 35 U.S.C. 154(b) by 392 days.

(21) Appl. No.: 18/143,666

(22) Filed: May 5, 2023

(65) Prior Publication Data

US 2024/0371602 A1    Nov. 7, 2024

(51) Int. Cl.
| | |
|---|---|
| *H01J 37/317* | (2006.01) |
| *H01J 37/08* | (2006.01) |
| *H01J 37/147* | (2006.01) |

(52) U.S. Cl.
CPC .......... *H01J 37/3171* (2013.01); *H01J 37/08* (2013.01); *H01J 37/1474* (2013.01)

(58) Field of Classification Search
CPC ..... H01J 37/3171; H01J 37/08; H01J 37/1474
See application file for complete search history.

(56) References Cited

U.S. PATENT DOCUMENTS

| | | | |
|---|---|---|---|
| 8,471,476 B2 | 6/2013 | Kurunczi et al. | |
| 10,622,192 B2* | 4/2020 | Yedave ............... | H01J 37/3171 |
| 2006/0289795 A1 | 12/2006 | Dubois et al. | |
| 2012/0187842 A1* | 7/2012 | DiVergilio ............ | H01J 37/026 |
| | | | 315/111.41 |
| 2013/0264498 A1 | 10/2013 | Chang et al. | |
| 2013/0320854 A1 | 12/2013 | Kurunczi et al. | |
| 2014/0326877 A1 | 11/2014 | Routh, Jr. | |

(Continued)

FOREIGN PATENT DOCUMENTS

| | | |
|---|---|---|
| TW | 202040622 A | 11/2020 |
| TW | 202040625 A | 11/2020 |
| WO | 2006/063046 A2 | 6/2006 |

OTHER PUBLICATIONS

International Search Report and Written Opinion mailed Aug. 1, 2024 in corresponding PCT application No. PCT/US2024/022981.

*Primary Examiner* — Georgia Y Epps
*Assistant Examiner* — Hanway Chang
(74) *Attorney, Agent, or Firm* — Nields, Lemack & Frame, LLC

(57) ABSTRACT

An ion implanter that includes an ion source to generate an ion beam, a platen disposed in a process chamber to support a workpiece that is treated with the ion beam, and a plasma flood gun that results in fewer particles in the process chamber is disclosed. The plasma flood gun includes at least one plasma chamber, each having at least one aperture through which low energy ions and electrons are emitted. A sweeper is located near the aperture, positioned so as to be between the aperture and the upstream components. The sweeper is heated using resistive elements or a halogen lamp so as to elevate its temperature, which limited the amount of deposition that occurs on the sweeper.

16 Claims, 4 Drawing Sheets

(56)  References Cited

U.S. PATENT DOCUMENTS

| | | |
|---|---|---|
| 2018/0269033 A1 | 9/2018 | Sinclair et al. |
| 2020/0303161 A1 | 9/2020 | Matsushita |
| 2021/0167056 A1* | 6/2021 | Or-Bach .............. H10D 84/038 |
| 2022/0059326 A1 | 2/2022 | Jiang |

* cited by examiner

300

305

307

310

313

312

311

HEATED PLASMA FLOOD GUN SWEEPER

This disclosure describes embodiments of a heated plasma flood gun sweeper for use in an ion implanter to limit particle deposition.

BACKGROUND

Semiconductor devices are fabricated using a plurality of processes, some of which implant ions into the workpiece. The incoming ion beam typically is very narrow in the height direction, but has a width that is greater than the diameter of the workpiece. This width may be achieved using a ribbon ion beam, or by the scanning of a spot ion beam.

To maintain the shape of the ion beam as it enters the process chamber, a plasma flood gun (PFG) may be used to inject low energy electrons into the beam. The addition of electrons helps prevent "beam blowup", in which the ion beam expands spatially in the process chamber due to the repulsion of positively charged ions from one another. The addition of low energy electrons to the ion beam may be used to mitigate this issue.

In certain embodiments, the low energy positive ions that are also created by the plasma flood gun may be attracted toward upstream components which are negatively charged. This may be problematic in that contact between these low energy positive ions and the negatively charged components may result in glitches.

Therefore, to limit the number of low energy positive ions that are attracted toward upstream components, a shield, or sweeper may be installed near the plasma flood gun. This sweeper blocks the most direct path from the plasma flood gun to the upstream components, making it more difficult for the low energy positive ions to reach these components.

However, the position of this sweeper is such that it is susceptible to deposition due to sputtering from the workpiece that is being implanted.

Therefore, it would be beneficial if there were a plasma flood gun that provided low energy electrons to reduce beam blowup, limited the number of positive ions that drifted toward upstream components and was also less susceptible to deposition caused by workpiece sputtering. It would be advantageous if this plasma flood gun occupied the same space that is used by current devices.

SUMMARY

An ion implanter that includes an ion source to generate an ion beam, a platen disposed in a process chamber to support a workpiece that is treated with the ion beam, and a plasma flood gun that results in fewer particles in the process chamber is disclosed. The plasma flood gun includes at least one plasma chamber, each plasma chamber having at least one aperture through which low energy ions and electrons are emitted. A sweeper is located near the aperture, positioned so as to be between the aperture and the upstream components. The sweeper is heated using resistive elements or a halogen lamp so as to elevate its temperature, which limits the amount of deposition that occurs on the sweeper.

According to one embodiment, an ion implanter is disclosed. The ion implanter comprises an ion source to generate an ion beam; an acceleration/deceleration stage comprising one or more electrodes, disposed between the ion source and a process chamber; a platen to support a workpiece that is treated with the ion beam, the platen positioned within the process chamber of the ion implanter; and a plasma flood gun disposed in the process chamber, the plasma flood gun comprising a plasma chamber including a first surface having one or more apertures through which low energy electrons and ions are emitted; and a heated sweeper, wherein the heated sweeper comprises a shield disposed proximate to the first surface of the plasma chamber near the apertures; and a heater disposed proximate to the shield, and further from the apertures; wherein the heater is used to heat the shield, wherein the heated sweeper limits an amount of low energy ions that travel from the apertures toward the one or more electrodes the in acceleration/deceleration stage. In some embodiments, the heater heats the shield to a temperature of between 150° C. and 500° C. In some embodiments, the heater comprises a halogen lamp. In some embodiments, the heater comprises a resistive heater. In some embodiments, the heated sweeper comprises a protective cover, positioned such that the heater is located between the shield and the protective cover. In certain embodiments, the protective cover is configured to cover an exposed surface of the heater.

According to another embodiment, a plasma flood gun is disclosed. The plasma flood gun comprises a plasma chamber including a first surface having one or more apertures through which low energy electrons and ions are emitted; and a heated sweeper, wherein the heated sweeper comprises a shield disposed on the first surface near the apertures; and a heater disposed proximate to the shield, and further from the apertures; wherein the heater is used to heat the shield. In some embodiments, the heater heats the shield to a temperature of between 150° C. and 500° C. In some embodiments, the heater comprises a halogen lamp. In some embodiments, the heater comprises a resistive heater. In some embodiments, the heated sweeper comprises a protective cover, positioned such that the heater is located between the shield and the protective cover. In certain embodiments, the protective cover is configured to cover an exposed surface of the heater.

According to another embodiment, a method of improving operation of an ion source to generate an ion beam, an acceleration/deceleration stage and a process chamber, is disclosed. The method comprises disposing a plasma flood gun in the process chamber to emit low energy electrons to reduce space charge of the ion beam and accumulation of charge on a surface of a workpiece supported by a platen disposed in the process chamber; affixing a sweeper to a surface of the plasma flood gun, wherein the sweeper is positioned to reduce a flow of positive ions from the plasma flood gun toward the acceleration/deceleration stage; and heating the sweeper, wherein heat reduces an amount of deposition that forms on the sweeper. In some embodiments, the sweeper is heated to a temperature of between 150° C. and 500° C. In some embodiments, the sweeper is heated using a halogen lamp. In some embodiments, the sweeper is heated using a resistive heater.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
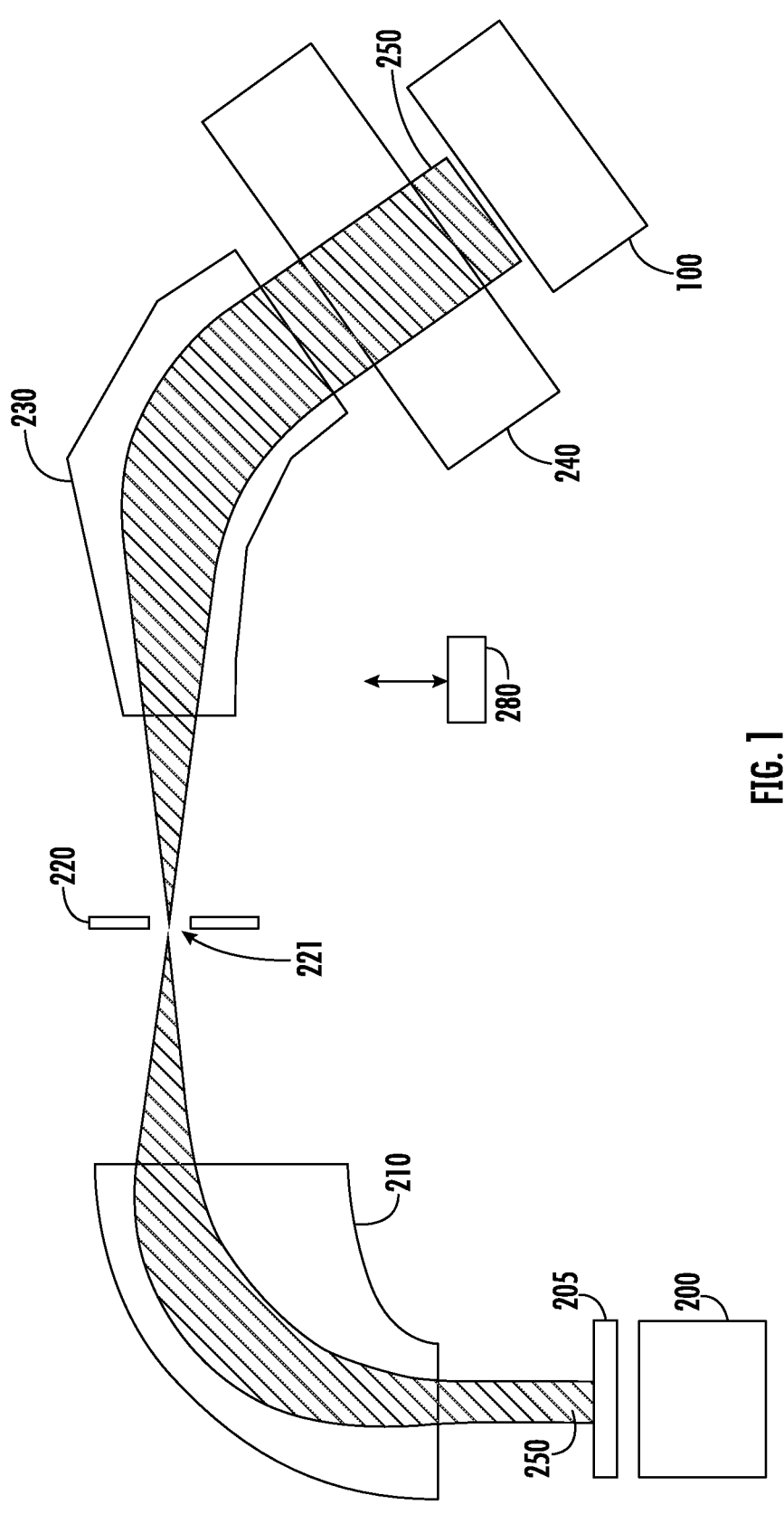
FIG. 1 is a block diagram of an ion implanter that uses the plasma flood gun according to one embodiment.

FIG. 1 shows an ion implanter that includes a process chamber 100 that includes a plasma flood gun. An ion source 200 is used to generate an ion beam 250. The ion source 200 may be an indirectly heated cathode (IHC) ion source. Alternatively, the ion source 200 may be a capacitively coupled plasma source, an inductively coupled plasma source, a Bernas source or another source. Thus, the type of ion source is not limited by this disclosure. Disposed outside and proximate the extraction aperture of the ion source 200 is the extraction optics 205, which may comprise one or more electrodes.

Located downstream from the extraction optics 205 is a mass analyzer 210. The mass analyzer 210 uses magnetic fields to guide the path of the extracted ion beam. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions in the ion beam 250 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions from the ion beam 250 that pass through the resolving aperture 221 and creates an ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 is a beam-line lens component configured to independently control deflection, deceleration, and focus of the ion beam. For example, the acceleration/deceleration stage 240 may be an electrostatic filter (EF). The acceleration/deceleration stage 240 may contain components, such as electrodes or rods, which may be negatively biased. The ion beam 250 that exits the acceleration/deceleration stage 240 enters the process chamber 100.

Figure 2:
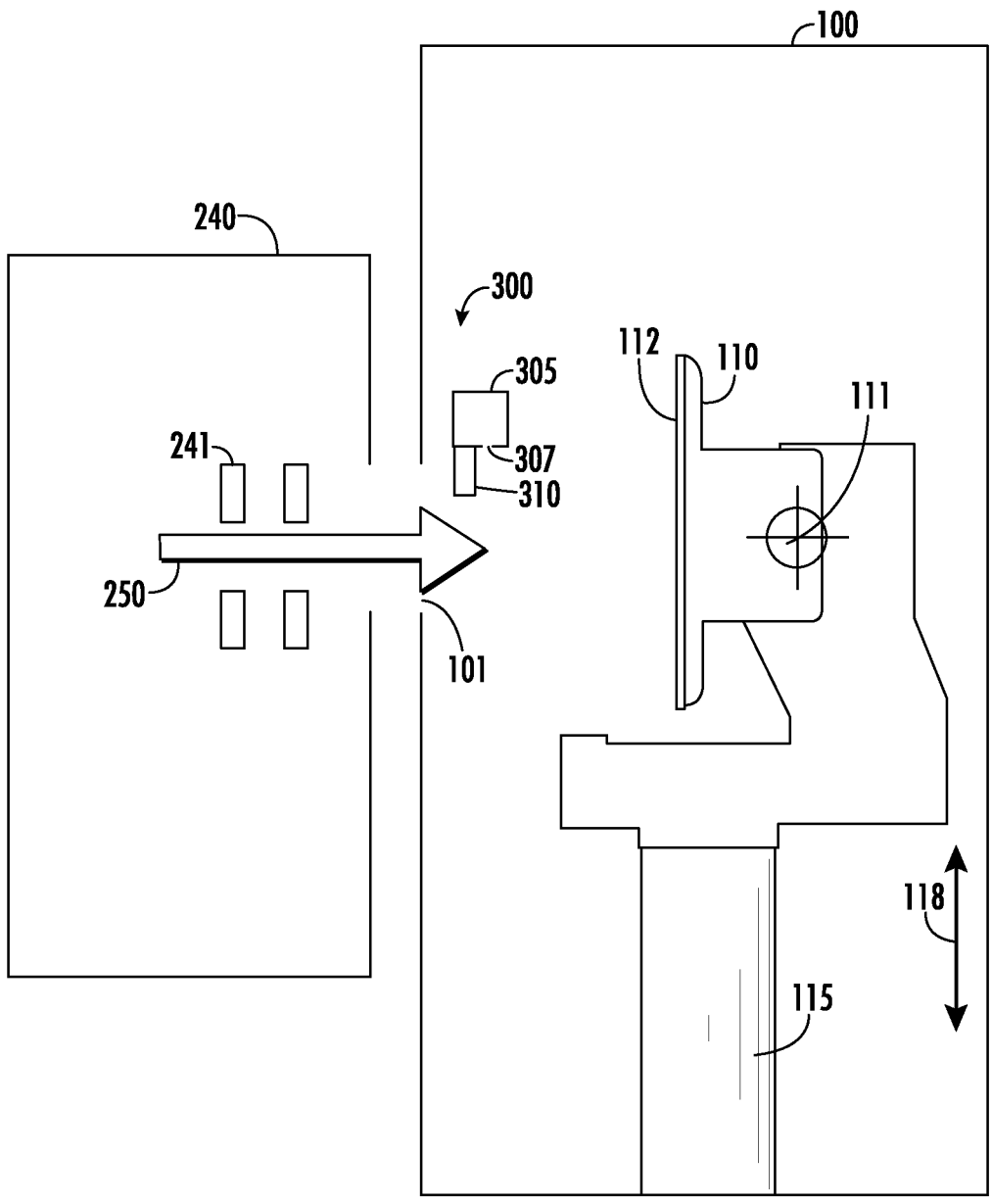
FIG. 2 is a block diagram of a process chamber with the plasma flood gun.

As best seen in FIG. 2, the process chamber 100 includes a platen 110, on which a workpiece 112 may be disposed. When in the operational position, the ion beam 250 impacts the workpiece 112. In addition, a plasma flood gun 300 is disposed near the entrance 101 to the process chamber 100.

A controller 280 may be in communication with one or more of the power supplies such that the voltage or current supplied by these power supplies may be monitored and/or modified. The controller 280 may include a processing unit, such as a microcontroller, a personal special computer, a purpose controller, or another suitable processing unit. The controller 280 may also include a non-transitory storage element, such as a semiconductor memory, a magnetic memory, or another suitable memory. This non-transitory storage element may contain instructions and other data that allows the controller 280 to perform the functions described herein.

In certain embodiments, the ion source 200 may generate a ribbon beam that travels through these components. Of course, other ion implanters may be utilized. For example, the ion implanter may generate a scanned ion beam rather than a ribbon ion beam. Such an ion implanter includes an ion source that creates a spot beam. This type of ion implanter also includes a mass analyzer and a mass resolving device, as described above. In addition, a scanner, which may be electrostatic or another type is used to create a scanned ion beam. The scanned ion beam may pass through an angle corrector. The angle corrector is designed to deflect ions in the scanned ion beam to produce an ion beam having parallel ion trajectories, thus focusing the scanned ion beam. Specifically, the angle corrector is used to alter the diverging ion trajectory paths into substantially parallel paths of the ion beam 250. In some embodiments, angle corrector may comprise magnetic pole pieces which are spaced apart to define a gap and a magnet coil which is coupled to a power supply. The scanned ion beam passes through the gap between the magnetic pole pieces and is deflected in accordance with the magnetic field in the gap. In other embodiments, the angle corrector may be an electrostatic lens sometimes referred to as a parallelizing lens.

FIG. 2 shows the process chamber 100 of FIG. 1 in more detail. The ion beam 250 enters the process chamber 100 through an entrance 101. A platen 110 is also disposed in the process chamber 100. The platen 110 may be an electrostatic platen that is used to clamp and hold the workpiece 112 while the ion beam 250 is directed into the process chamber 100. In some embodiments, the platen 110 may be elevated and lowered in a Y direction 118 through the movement of shaft 115. Additionally, the platen 110 may rotate about X axis 111. In certain embodiments, the platen 110 may be rotated 90° so that the clamping surface of the platen 110 is horizontal, allowing a workpiece 112 to be placed on the platen 110. The platen 110 is then rotated into the operational, or implant position, which is shown in FIG. 2.

A plasma flood gun 300 is disposed near the entrance 101 of the process chamber 100. The plasma flood gun 300 includes at least one plasma chamber 305 that is used to generate a plasma. In some embodiments, an inert gas, such as xenon, may be introduced into the plasma chamber 305. Low energy electrons and positive ions exit the plasma chamber 305 through one or more apertures 307 located on the first surface of the plasma chamber 305, which is the surface disposed nearest the ion beam 250. The plasma flood gun 300 also includes a sweeper 310 that is used to reduce the flow of positive ions from the plasma chamber 305 toward negatively charged electrodes 241 located in the acceleration/deceleration stage 240. The sweeper 310 may be disposed proximate to or affixed to the first surface of the plasma chamber 305. Further, the sweeper 310 is heated to reduce deposition.

Figure 3:
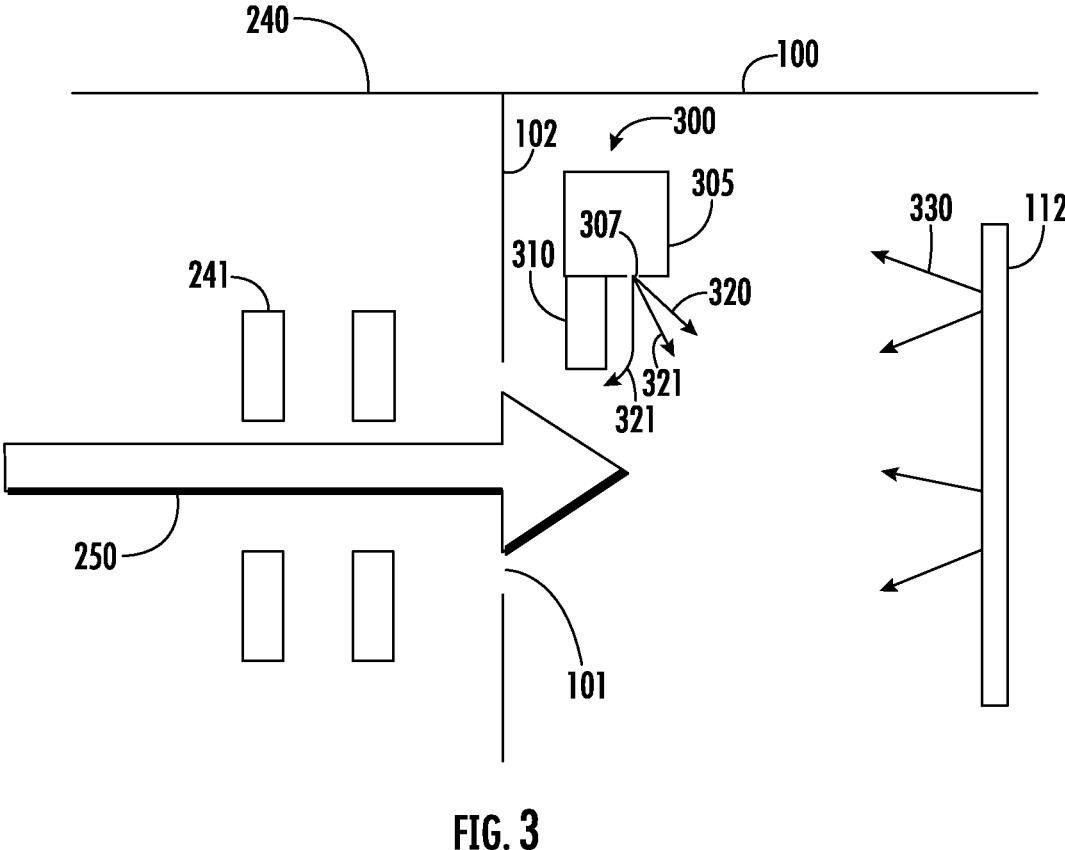
FIG. 3 shows the path of ions and particles within the process chamber of FIG. 2.

FIG. 3 shows the path of various ions and other particles within the process chamber 100 during operation. The ion beam 250 enters the process chamber 100 through the entrance 101 and is directed toward the workpiece 112. The workpiece 112 may be, for example, a bare silicon wafer, a silicon nitride wafer, a silicon oxide wafer, or another type of semiconductor wafer. As described above, low energy electrons 320 and low energy positive ions 321 are emitted from the aperture 307 of the plasma chamber 305. The electrons 320 are attracted to the ion beam 250, which has a net positive charge. The introduction of the electrons 320 neutralizes some of the space charge of the ion beam 250 and helps reduce beam blowup. The electrons 320 also help reduce the accumulation of charge on the surface of the workpiece 112, which is disposed on the platen 110. The positive ions 321, which may be xenon ions, may be attracted toward electrodes in the 241 the acceleration/ deceleration stage 240. However, as shown, the presence of the sweeper 310 lengthens the path that the positive ions 321 travel to reach the electrodes 241. Additionally, the presence of the sweeper 310 reduces the acceleration (or electrical) field that is caused by the electrodes 241 in the vicinity of the aperture 307 of the plasma chamber 305. Consequently, fewer positive ions 321 enter the acceleration/deceleration stage 240.

Additionally, the impact of the ion beam 250 on the workpiece 112 may cause the sputtering of condensable molecules, particles, and other materials 330 from the workpiece 112. These materials 330 may travel upstream and deposit on the interior walls 102 of the process chamber 100, on the side of the plasma chamber 305 and on the sweeper 310. Due to the proximity of the sweeper 310 to the ion beam 250, deposition of insulating layers on the sweeper 310 may be detrimental to the operating time of the ion implanter. Specifically, preventative maintenance may be performed to remove any deposition from the sweeper 310 before that deposited material flakes from the sweeper 310 and is carried toward the workpiece 112 by the ion beam 250.

Unexpectedly, testing and simulation has shown that the amount of material that is deposited on the sweeper 310 may be significantly reduced if the sweeper is maintained at an elevated temperature, such as between 150° C. and 500° C. In some embodiments, the elevated temperature may be between 250° C. and 350° C., such as about 300° C. Thus, the sweeper 310 of the present disclosure is heated.

Figure 4:
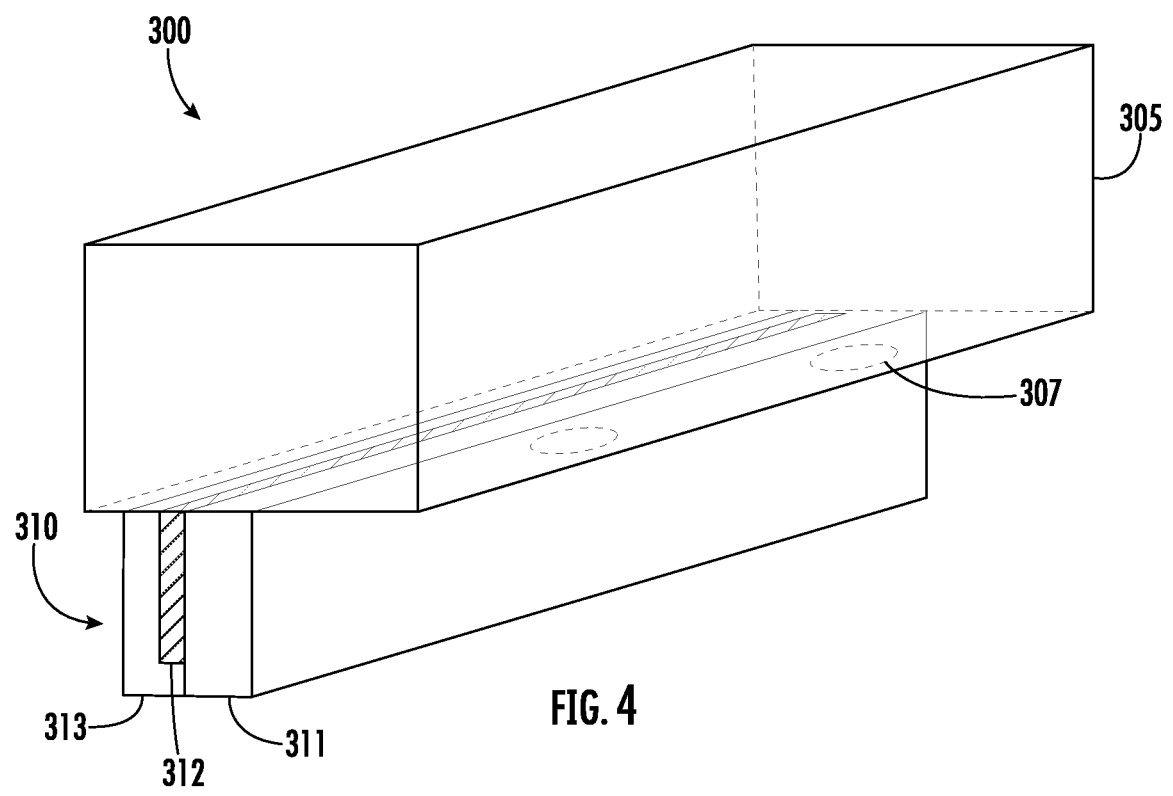
FIG. 4 show the plasma flood gun according to one embodiment.

FIG. 4 shows one embodiment of a plasma flood gun that utilizes a sweeper 310 that is heated. As described above, the plasma flood gun 300 includes at least one plasma chamber 305. Each plasma chamber 305 includes one or more apertures 307 on the surface closest to the ion beam 250, which is referred to as the first surface. Ions and low energy electrons are emitted through the apertures 307. The sweeper 310 is disposed near the apertures 307, and may be affixed to the first surface of the plasma chamber 305. The sweeper 310 is disposed between the apertures 307 and the acceleration/deceleration stage 240 so as to block ions from exiting the apertures 307 and travelling toward the electrodes 241. The sweeper 310 may have a length that is at least as wide as the ion beam 250. The sweeper 310 extends from the first surface toward the ion beam 250 and may have a height of about 5 cm. The thickness of the sweeper 310, which is defined in the direction of the ion beam 250, may be between 2 and 10 cm. Of course, other dimensions may be used. In this embodiment, the sweeper 310 may include several components. Located closest to the apertures 307 may be a shield 311, which may be made of graphite, silicon, silicon carbide, or aluminum coated with silicon or silicon carbide. The shield 311 may have a thickness of between 0.5 and 2.5 cm. A heater 312 may be disposed proximate to the shield 311, further from the apertures 307. A protective cover 313 may then be used to cover the heater 312. The protective cover 313 is positioned such that the heater 312 is located between the shield 311 and the protective cover 313. The protective cover 313 may be made from graphite or another suitable material, such as those used for the shield 311. In addition, in some embodiments, the protective cover 313 also protects the exposed surface of the heater 312, where the exposed surface is defined as the surface of the heater 312 which is furthest from the plasma chamber 305. The protective cover 313 may have a thickness that is roughly the same as that of the shield 311.

The heater 312 may be implemented in a variety of different ways. In one embodiment, the heater 312 is a halogen lamp. The halogen lamp is sandwiched between the shield 311 and the protective cover 313. As noted above, the protective cover 313 may also cover the exposed surface of the halogen lamp.

In another embodiment, the heater 312 may comprise one or more resistive heaters that may be proximate to or in contact with the shield 311. In one embodiment, the resistive heater may comprise a circuit surrounded by one or more electrically insulating layers. In one embodiment, the circuit may be one or more graphite pieces. The graphite pieces may be 1-2 mm thick. However, in another embodiment, the circuit may be made from another electrically conducting material, such as tungsten. The insulating layers surrounding the circuit may be ceramic layers. In some embodiments, the insulating layers may be aluminum nitride or aluminum oxide. However, it is understood that the insulating layers may be made from some other insulating material.

In another embodiment, the resistive heater may be a sheath-type heater, wherein a resistive element is encased in a metal sheath or tube.

In yet another embodiment, the resistive heater may be thin film-type heater, wherein a thin film of a conductive material, such as silicon, silicon carbide, carbon or tungsten, is formed on a ceramic material, and then overlaid with an additional ceramic layer.

Of course, there are other mechanisms that may be used to create a resistive heater which may be employed herein.

The present system and method have many advantages. Plasma flood guns are useful in reducing beam blowup in the process chamber. In some configurations, positive ions from the plasma flood gun toward travel the electrodes 241 in the acceleration/deceleration stage 240, which may result in glitching. Introduction of traditional sweepers may help alleviate the glitching. However, when certain species, such as phosphorus, boron, boron trifluoride and arsenic, are used, material sputtered from the workpiece surface is deposited on the sweeper. Over time, the deposited material may flake and create particles within the process chamber. By heating the sweeper, this issue may be mitigated. In one test, 144 workpieces were implanted with phosphorus. These workpieces include bare silicon, silicon nitride and silicon oxide wafers. After these workpieces were implanted, the thickness of the material deposited on the sweeper was measured. When the sweeper was maintained at 250° C., the thickness of the material that was deposited thereon was roughly 50% of the thickness of the material deposited when the sweeper was at room temperature. Thus, the interval between preventive maintenance intervals may be increased by more than 50%, while the thickness of material that is deposited on the sweeper between intervals is unchanged. This allows greater availability of the ion implanter. Further, the slower rate of deposition also reduces the number of particles in the process chamber.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

Accordingly, the claims set forth below should be construed in view of the full breadth and spirit of the present disclosure as described herein.

What is claimed is:

1. An ion implanter comprising:
an ion source to generate an ion beam;
an acceleration/deceleration stage comprising one or more electrodes, disposed between the ion source and a process chamber;
a platen to support a workpiece that is treated with the ion beam, the platen positioned within the process chamber of the ion implanter; and
a plasma flood gun disposed in the process chamber, the plasma flood gun comprising:
a plasma chamber including a first surface having one or more apertures through which low energy electrons and ions are emitted; and
a heated sweeper disposed between the apertures and the acceleration/deceleration stage, wherein the heated sweeper comprises:
a shield; and
a heater disposed further from the apertures than the shield; wherein the heater is used to heat the shield, wherein the heated sweeper limits an amount of low energy ions that travel from the apertures toward the one or more electrodes in the acceleration/deceleration stage.

2. The ion implanter of claim 1, wherein the heater heats the shield to a temperature of between 150° C. and 500° C.

3. The ion implanter of claim 1, wherein the heater comprises a halogen lamp.

4. The ion implanter of claim 1, wherein the heater comprises a resistive heater.

5. The ion implanter of claim 1, wherein the heated sweeper comprises a protective cover, positioned such that the heater is located between the shield and the protective cover.

6. The ion implanter of claim 5, wherein the protective cover is configured to cover an exposed surface of the heater.

7. A plasma flood gun, comprising:
a plasma chamber including a first surface having one or more apertures through which low energy electrons and ions are emitted; and a heated sweeper, wherein the heated sweeper comprises:
a shield disposed on the first surface near the apertures; and
a heater disposed further from the apertures than the shield; wherein the heater is used to heat the shield.

8. The plasma flood gun of claim 7, wherein the heater heats the shield to a temperature of between 150° C. and 500° C.

9. The plasma flood gun of claim 7, wherein the heater comprises a halogen lamp.

10. The plasma flood gun of claim 7, wherein the heater comprises a resistive heater.

11. The plasma flood gun of claim 7, wherein the heated sweeper comprises a protective cover, positioned such that the heater is located between the shield and the protective cover.

12. The plasma flood gun of claim 11, wherein the protective cover is configured to cover an exposed surface of the heater.

13. A method of improving operation of an ion implanter comprising an ion source to generate an ion beam, an acceleration/deceleration stage and a process chamber, the method comprising:
disposing a plasma flood gun in the process chamber to emit low energy electrons to reduce space charge of the ion beam and accumulation of charge on a surface of a workpiece supported by a platen disposed in the process chamber;
affixing a sweeper to a surface of the plasma flood gun, wherein the sweeper is positioned to reduce a flow of positive ions from the plasma flood gun toward the acceleration/deceleration stage; and
heating the sweeper, wherein heat reduces an amount of deposition that forms on the sweeper.

14. The method of claim 13, wherein the sweeper is heated to a temperature of between 150° C. and 500° C.

15. The method of claim 14, wherein the sweeper is heated using a halogen lamp.

16. The method of claim 14, wherein the sweeper is heated using a resistive heater.

* * * * *